US011277941B1

(12) United States Patent
Raghupathy et al.

(10) Patent No.: US 11,277,941 B1
(45) Date of Patent: Mar. 15, 2022

(54) THERMAL-CONTROL SYSTEM OF A VIDEO-RECORDING DOORBELL AND ASSOCIATED VIDEO-RECORDING DOORBELLS

(71) Applicant: Google LLC, Mountain View, CA (US)

(72) Inventors: Arun Prakash Raghupathy, Pleasanton, CA (US); Ihab A. Ali, Cupertino, CA (US); Jacobi Colton Grillo, San Francisco, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/061,872

(22) Filed: Oct. 2, 2020

(51) Int. Cl.
*H05K 7/20* (2006.01)
*H04N 7/18* (2006.01)

(52) U.S. Cl.
CPC ......... *H05K 7/20481* (2013.01); *H04N 7/186* (2013.01); *H05K 7/20454* (2013.01); *H05K 7/20509* (2013.01)

(58) Field of Classification Search
CPC ... H05K 7/2039–20518; H05K 1/0203; H04N 7/186
See application file for complete search history.

(56) References Cited

U.S. PATENT DOCUMENTS

| 5,403,782 | A | 4/1995 | Dixon et al. |
| 9,113,051 | B1 | 8/2015 | Scalisi |
| 10,042,429 | B2 | 8/2018 | Alameh et al. |
| 10,319,213 | B1* | 6/2019 | Conner ................. G01K 3/005 |
| 10,418,672 | B2* | 9/2019 | Tso ...................... H04N 5/2256 |
| 10,708,472 | B2* | 7/2020 | Jeong ..................... H04N 7/186 |
| 2005/0068506 | A1 | 3/2005 | Moriwaki et al. |
| 2011/0149533 | A1 | 6/2011 | Luo et al. |
| 2015/0036036 | A1 | 2/2015 | Gao et al. |
| 2016/0043453 | A1 | 2/2016 | Ebner et al. |
| 2016/0157333 | A1 | 6/2016 | Kim et al. |
| 2016/0189502 | A1 | 6/2016 | Johnson et al. |
| 2016/0191864 | A1* | 6/2016 | Siminoff ................ H04N 7/186 348/155 |
| 2018/0143671 | A1 | 5/2018 | Lee et al. |
| 2019/0089872 | A1 | 3/2019 | Rukes et al. |

(Continued)

FOREIGN PATENT DOCUMENTS

| EP | 3445046 | 2/2019 |
| GB | 2369450 | 3/2002 |

OTHER PUBLICATIONS

"1080p Wi-Fi Video Doorbell", Retrieved at: https://www.lorextechnology.com/video-doorbell/1080p-full-hd-wi-fi-video-doorbell/LNWDB1-1-p—on May 28, 2021, 15 pages.

(Continued)

*Primary Examiner* — Zachary Pape
(74) *Attorney, Agent, or Firm* — Colby Nipper PLLC (57) ABSTRACT

This document describes a thermal-control system that is integrated into a video-recording doorbell. The thermal-control system includes a combination of heat spreaders and materials with high thermal conductivity. The thermal-control system may spread and dissipate energy from a thermal-loading condition effectuated upon the video-recording doorbell to concurrently maintain temperatures of multiple thermal zones on or within the video-recording doorbell at or below prescribed temperature thresholds.

20 Claims, 7 Drawing Sheets

(56) References Cited

U.S. PATENT DOCUMENTS

2019/0373314 A1 12/2019 Collins et al.
2020/0249117 A1 8/2020 Lewander Xu et al.

OTHER PUBLICATIONS

"An Essential Wireless Video Doorbell", Retrieved at: https://www.arlo.com/en-us/doorbell/video/arlo-essential-video-doorbell-wire-free.html—on May 28, 2021, 8 pages.
"EZViZ DB1", Retrieved at: https://www.ezvizlife.com/product/db1/960—on May 28, 2021, 9 pages.
Orsan, "What's Inside?—vol. 2: Dropcam Pro", Accessed on Apr. 21, 2020 from https://medium.com/@candemir/whats-inside-vol-2-dropcam-pro-f458d96ecc9a, Dec. 21, 2014.
"Invitation to Pay Additional Fees", Application No. PCT/US2021/044204, Nov. 10, 2021, 10 pages.

\* cited by examiner

THERMAL-CONTROL SYSTEM OF A VIDEO-RECORDING DOORBELL AND ASSOCIATED VIDEO-RECORDING DOORBELLS

BACKGROUND

Video-recording doorbells are becoming a popular addition to home security systems. A video-recording doorbell may be battery-powered and include multiple integrated-circuit (IC) devices, such as a passive infrared (PIR) sensor IC device that detects motion, an image sensor IC device that captures images, and a wireless-communication component that transmits and receives data. The video-recording doorbell may also include a system-on-chip (SoC) IC device that executes a machine-learning algorithm.

The video-recording doorbell may, in some instances, include a thermal-control system fabricated using a stamped sheet metal structure that can dissipate heat from the SoC IC device during a thermal-loading condition, such as when the SoC IC device executes the machine-learning algorithm for a short period of time and dissipates heat at a rate of up to 1-1/2 Watts (W). In such an instance, the thermal-control system may be capable of dissipating the heat from the thermal-loading condition to maintain a single prescribed temperature limit across the multiple IC devices, effectively treating the video-recording doorbell as a single thermal zone.

However, under certain thermal-loading conditions, such as when the SoC IC device executes the machine-learning algorithm for a lengthy period of time and when the video-recording doorbell is exposed to solar radiation, the thermal loading on the video-recording doorbell can approach or exceed 3 W. In such an instance, the thermal-control system may be inadequate to maintain the single prescribed temperature limit across the multiple IC devices. The inability of the thermal-control system to dissipate heat from the video-recording doorbell may result in (i) damage to one or more IC devices of the video-recording doorbell and/or (ii) a housing of the video-recording doorbell exceeding a prescribed ergonomic touch-temperature limit.

SUMMARY

This document describes a thermal-control system that is integrated into a video-recording doorbell. The thermal-control system includes a combination of heat spreaders and materials with high thermal conductivity. The thermal-control system may spread and dissipate energy from a thermal-loading condition effectuated upon the video-recording doorbell to concurrently maintain temperatures of multiple thermal zones on or within the video-recording doorbell at or below prescribed temperature thresholds.

In some aspects, a thermal-control system for a video-recording doorbell and associated video-recording doorbells is described. The thermal-control system includes a first thermal-control subsystem configured to transfer a first quantity of heat to a first housing component and a second housing component of the video-recording doorbell. The first thermal-control subsystem includes a first thermal interface material that is positioned between an SoC IC device and a first hybrid graphite sheet that is fixed to a first heat spreader. The first thermal-control subsystem also includes a second thermal interface material that is positioned between a logic printed circuit board (PCB), to which the SoC IC device is attached, and a second heat spreader.

The thermal-control system also includes a second thermal-control subsystem configured to transfer a second quantity of heat to the first housing component and the second housing component of the video-recording doorbell. The second thermal-control subsystem includes a sensor PCB that has a separate ground plane for each of a passive infrared sensor IC device and an image sensor IC device. The second thermal-control subsystem also includes a third thermal interface material that is positioned between the sensor PCB and a third heat spreader.

In other aspects, a video-recording doorbell is described. The video-recording doorbell includes an SoC IC device, a pressable button, a first housing component, and a second housing component. The video-recording doorbell also includes a thermal-control system that is configured to concurrently maintain temperatures of multiple thermal zones of the video-recording doorbell during a thermal-loading condition. During the thermal-loading condition, the thermal-control system may spread and dissipate heat to concurrently maintain (i) a first temperature of a first thermal zone that includes the system-on-chip at or below a first prescribed temperature threshold, (ii) a second temperature of a second thermal zone that includes the pressable button at or below a second prescribed temperature threshold, and (iii) a third temperature of a third thermal zone that includes the first housing component and the second housing component at or below a third prescribed temperature threshold.

The details of one or more implementations are set forth in the accompanying drawings and the following description. Other features and advantages will be apparent from the description, the drawings, and the claims. This summary is provided to introduce subject matter that is further described in the Detailed Description. Accordingly, a reader should not consider the summary to describe essential features nor limit the scope of the claimed subject matter.

BRIEF DESCRIPTION OF THE DRAWINGS

The details of one or more aspects of a thermal-control system for a video-recording doorbell and associated video-recording doorbells are described below. The use of the same reference numbers in different instances in the description and the figures indicate similar elements.

DETAILED DESCRIPTION

This document describes a thermal-control system that is integrated into a video-recording doorbell. The thermal-control system includes a combination of heat spreaders and materials having high thermal-conductivity. The thermal-control system may spread and dissipate energy from a thermal-loading condition effectuated upon the video-recording doorbell to concurrently maintain temperatures of multiple thermal zones within the video-recording doorbell at or below prescribed temperature thresholds.

While features and concepts of the described thermal-control system can be implemented in any number of different environments and devices, aspects are described in the context of the descriptions and examples below.

Heat transfer, in general, is energy that is in transit due to a temperature difference. If one or more temperature differences exist across components of a system, such as the video-recording doorbell, heat (e.g., energy in Joules (J)) will transfer from higher-temperature zones to lower-temperature zones to minimize the temperature differences. There are several mechanisms for heat transfer across the components of a system to minimize temperature differences, including convection, radiation, and conduction.

Convection, or heat transfer from a surface due to movement of molecules within fluids such as gases and liquids, can be quantified by equation 1 below:

$$q_{conv} = hA(T_s - T_\infty) \quad (1)$$

For equation 1, $q_{conv}$ represents a rate of heat transfer from a surface through convection (e.g., in J per second or Watts (W)), h represents a convection heat transfer coefficient (e.g., in Watts per meter squared (W/m$^2$)), $T_s$ represents a temperature of a surface (e.g., in Kelvin (K) or degrees Celsius (° C.)), and $T_\infty$ represents a temperature of a fluid (e.g., in K or ° C.) to which the surface is exposed. The term A represents the area of a surface (e.g., in m$^2$).

Radiation, or heat transfer from a surface through electromagnetic radiation, can be quantified by equation 2 below:

$$q_{rad} = \varepsilon A \sigma (T_s^4 - T_{surr}^4) \quad (2)$$

For equation 2, $q_{rad}$ represents a rate of heat transfer through radiation (e.g., in W), $\varepsilon$ represents emissivity (dimensionless), $\sigma$ represents the Stefen-Boltzmann constant (e.g., $\sigma = 5.67 \times 10^{-8}$ W/(m$^2 \cdot$K$^4$)), $T_s$ represents a temperature of a surface (e.g., in K or ° C.), and $T_{surr}$ represents a temperature of surroundings of the surface (e.g., K or ° C.). The term A represents an area of the surface (e.g., in m$^2$).

Conduction, or heat transfer through a solid body through atomic and molecular activity, can be quantified by equation 3 below:

$$q_{cond} = -kA \frac{dT}{dx} \quad (3)$$

For equation 3, $q_{cond}$ represents a rate of heat transfer in a solid material through conduction (e.g., in W), k represents a thermal conductivity of the solid material (e.g., in W/(m·K)), and dT/dx represents a temperature gradient through the solid material (e.g., in K/m or ° C./m). The term A represents a cross-sectional area of the solid material (e.g., in m$^2$).

For a video-recording doorbell, heat transfer between components may occur using one or more of the heat transfer mechanisms described above. In general, and in accordance with equations (1) and (2), heat transfer can be varied by increasing or decreasing surface areas for convection and/or radiation within the video-recording doorbell (e.g., increasing or decreasing surface areas of heat spreading mechanisms). Furthermore, and in accordance with equation (3), heat transfer can be varied by choosing one or more interfacing materials having specific thermal conductivities. Through careful design of heat spreaders and the use of interfacing materials having the specific thermal conductivities, a thermal-control system of the video-recording doorbell can concurrently maintain temperatures of different thermal zones at or below different prescribed temperature thresholds during a thermal-loading condition.

Figure 1:
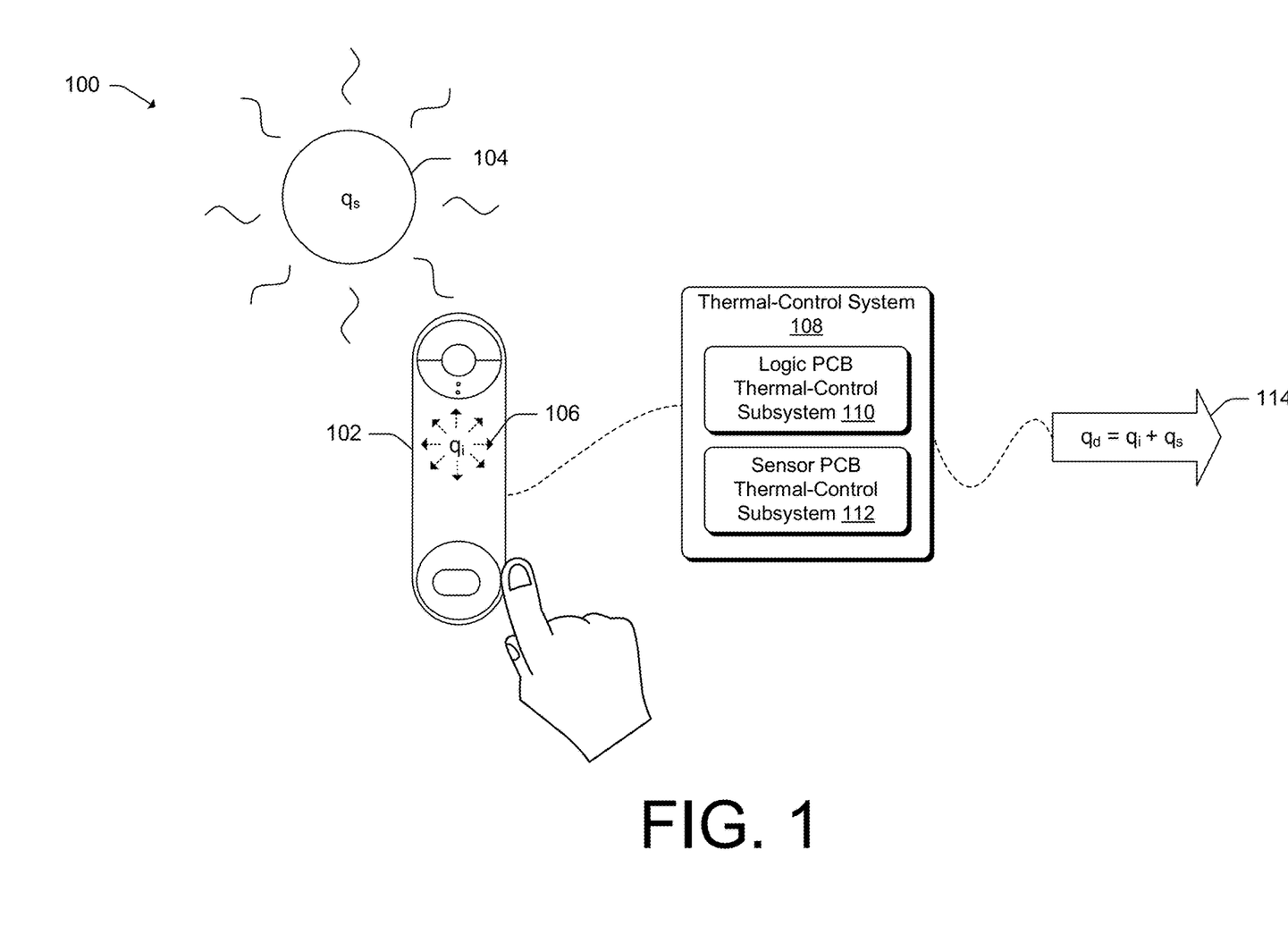
FIG. 1 illustrates an example operating environment in which aspects of a thermal-control system for a video-recording doorbell can be implemented.

FIG. 1 illustrates an example operating environment 100 having a video-recording doorbell 102. In the example operating environment 100, a solar source (e.g., the sun) is radiating a solar heat load 104 (e.g., $q_s$) onto exterior surfaces of the video-recording doorbell 102. In the example operating environment 100, at least one electronic device (e.g., integrated circuitry) is generating an internal heat load 106 (e.g., $q_i$) within the video-recording doorbell 102. The example operating environment 100 may include a 1000 Watts per square meter (W/m$^2$) solar heat load 104, and a 3 W internal heat load 106.

FIG. 1 also illustrates elements of a thermal-control system 108 that may control multiple thermal zones of the video-recording doorbell 102. In general, the thermal-control system 108 may spread, store, and dissipate energy from a thermal-loading condition (e.g., the solar heat load 104 in combination with the internal heat load 106) effectuated upon the video-recording doorbell 102 to concurrently maintain temperatures of multiple thermal zones within the video-recording doorbell 102.

In instances where the multiple thermal zones of the video-recording doorbell 102 have different respective temperature thresholds, the ability of the thermal-control system 108 to concurrently maintain temperatures of the multiple thermal zones at or below the different prescribed temperature thresholds is advantageous over other thermal-control systems for other video-recording doorbells that lack such capabilities. For example, in addition to ensuring that thermal performance of the video-recording doorbell 102 meets an ergonomic requirement (e.g., touch temperature), the ability of the thermal-control system 108 to maintain the multiple thermal zones at or below different and respective prescribed temperature thresholds may extend the life of one or more IC devices included in the video-recording doorbell 102.

The thermal-control system 108 includes a logic PCB thermal-control subsystem 110 and a sensor PCB thermal-control subsystem 112. Under the thermal-loading condition, the dissipated heat 114 (e.g., $q_d$), as spread throughout the video-recording doorbell 102 using the logic PCB thermal-control subsystem 110 and the sensor PCB thermal-control subsystem 112, may be equivalent to a sum of the solar heat load 104 and the internal heat load 106 (e.g., $q_d = q_i + q_s$).

Figure 2:
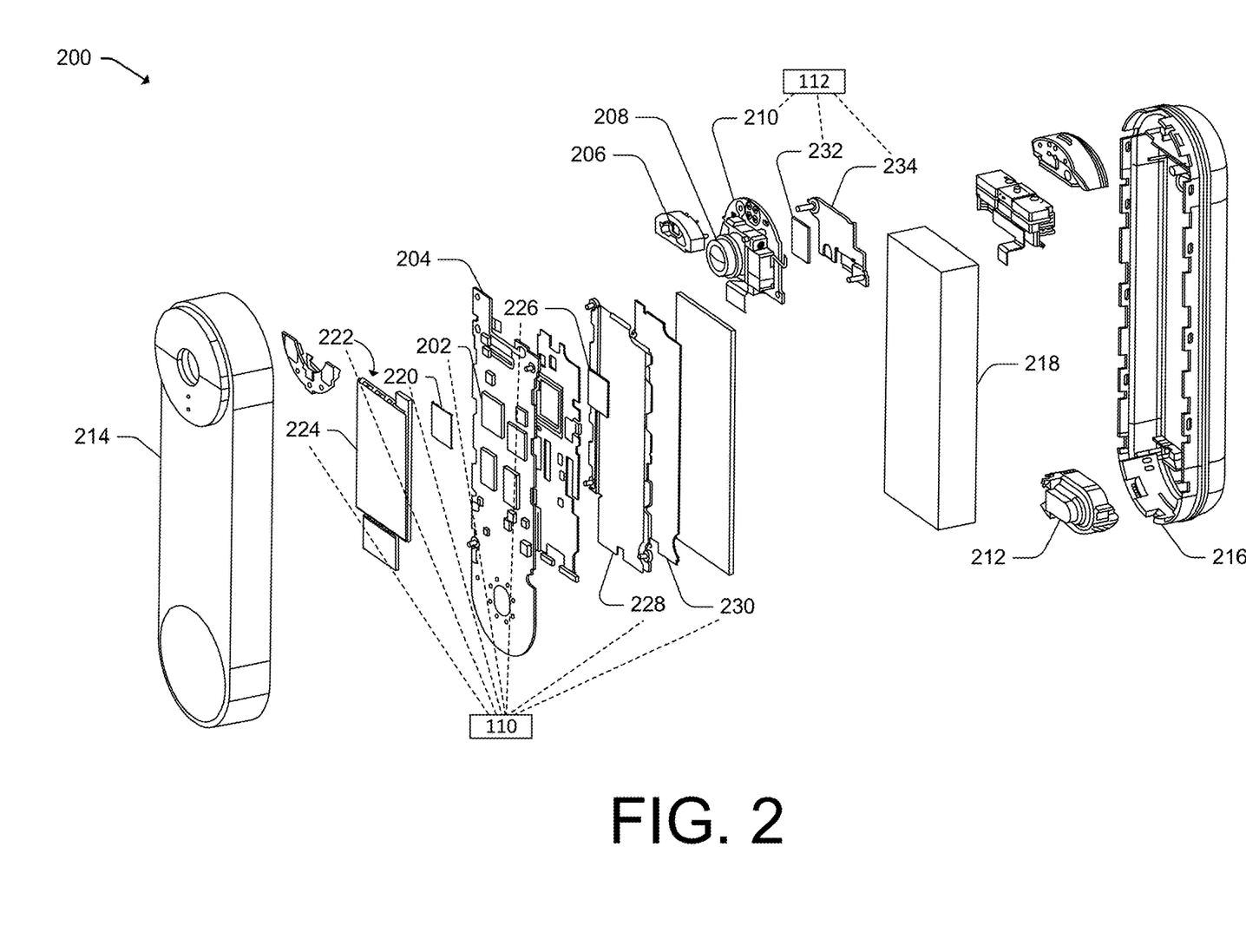
FIG. 2 illustrates an exploded, isometric view of an example video-recording doorbell in accordance with one or more aspects.

FIG. 2 illustrates an exploded, isometric view 200 of the video-recording doorbell 102 of FIG. 1. As illustrated in FIG. 2, the video-recording doorbell 102 includes an SoC IC device 202 that is mounted to a logic PCB 204. In the operating environment 100, the SoC IC device 202 may execute machine-learning algorithms for an extended duration (e.g., 10 minutes or more), which generates portions of an internal heat load (e.g., the internal heat load 106 as illustrated in FIG. 1).

The video-recording doorbell also includes a PIR sensor IC device 206 and an image sensor IC device 208. The PIR sensor IC device 206 and the image sensor IC device 208 are mounted to a sensor PCB 210. The PIR sensor IC device 206 may sense motion external to the video-recording doorbell 102, while the image sensor IC device 208 may capture images within a field of view of the video-recording doorbell 102.

The video-recording doorbell includes a pressable button 212, a first housing component 214, and a second housing component 216. The first housing component 214 and the second housing component 216 may, in general, be complementary in size and shape. For example, as illustrated, the first housing component 214 is elongated along a first axis and includes a first set of opposing ends that have a generally radial curvature. The second housing component 216 is elongated along a second axis that is generally parallel to the first axis. Furthermore, the second housing component 216, as illustrated, includes a second set of opposing ends that substantially match the generally radial curvature of the first set of opposing ends of the first housing component 214. The first housing component 214 and the second housing component 216 may include recesses and/or channels for alignment and coupling.

Continuing with FIG. 2, the video-recording doorbell 102 further includes a battery 218. The battery 218 may power the video-recording doorbell 102. Multiple thermal-control subsystems (e.g., the logic PCB thermal control subsystem 110 and the sensor PCB thermal-control subsystem 122) may be included in the video-recording doorbell 102 to concurrently control multiple thermal zones within the video-recording doorbell 102. The thermal-control subsystems may concurrently spread the heat (e.g., solar heat load 104, internal heat load 106 of FIG. 1) throughout the video-recording doorbell 102 using heat transfer modes that include conduction, convection, and/or radiation. The heat may subsequently be dissipated through exterior surfaces of the video-recording doorbell 102 (e.g., surfaces of the pressable button 212, the first housing component 214, the second housing component 216).

The logic PCB thermal-control subsystem 110 may include elements directed to conducting and spreading heat from the SoC IC device 202. For instance, the logic PCB thermal-control subsystem 110 may include a first thermal interface material (TIM) 220 (e.g., an SoC IC device topside TIM) and a first hybrid graphite sheet 222 (not visible in FIG. 2) fixed to a first heat spreader 224 (e.g., an electromagnetic interference (EMI) heat spreader) that doubles as an electromagnetic interference (EMI) shield. The first heat spreader 224 may have a substantially rectangular shape that substantially fits within an outline of the logic PCB 204. For example, the first heat spreader 224 may have a width that is approximately 80% to 100% of a width of the logic PCB 204 and a length that is approximately 40% to 60% of a length of the logic PCB 204.

The logic PCB thermal-control subsystem 110 may also include a second TIM 226 (e.g., an SoC IC device backside TIM), a second heat spreader 228 (e.g., a logic PCB heat spreader), and a second hybrid graphite sheet 230 that is fixed to the second heat spreader 228. The second heat spreader 228 may have a substantially rectangular shape that substantially fits within an outline of the logic PCB 204. For example, the second heat spreader 228 may have a width that is approximately 80% to 100% of a width of the logic PCB 204 and a length that is approximately 60% to 90% of a length of the logic PCB 204.

As illustrated in FIG. 2, the first TIM 220 is in thermal contact with, and positioned between, the SoC IC device 202 and the first hybrid graphite sheet 222. Also, as illustrated in FIG. 2, the second TIM 226 is in thermal contact with, and positioned between, the second heat spreader 228 and a second surface of a logic PCB 204 that is opposite a first surface of the logic PCB 204 to which the SoC IC device 202 is mounted. In some instances, the logic PCB 204 may include holes and or notches that may be used to align the logic PCB 204 to the second heat spreader 228 (e.g., the second heat spreader 228 may have flanges and/or alignment pins).

Elements of the logic PCB thermal-control subsystem 110 may include a combination of materials and/or material stacks. For example, the first heat spreader 224 may include a copper material while the second heat spreader 228 may include an aluminum alloy material. The first hybrid graphite sheet 222 and the second hybrid graphite sheet 230 may each include a layering of graphite, pressure-sensitive adhesive (PSA), and polyethylene terephthalate (PET) films. The first TIM 220 and the second TIM 226 include a gel material that includes a silicone-rubber material injected with nanoparticles (e.g., aluminum nanoparticles, beryllium-nitride nanoparticles). Alternatively, the first TIM 220 and the second TIM 226 might include a thermal grease material or a thermally-conductive foam material.

The sensor PCB thermal-control subsystem 112 may include elements directed to conducting and spreading heat away from the PIR sensor IC device 206 and the image sensor IC device 208. The sensor PCB thermal-control subsystem 112 may conduct and spread heat originating from a solar source and/or the SoC IC device 202 (e.g., the solar heat load 104 and/or the internal heat load 106 of FIG. 1). The sensor PCB 210 may be enhanced, including separate ground planes for the PIR sensor IC device 206 and the image sensor IC device 208 to enable thermal isolation between the PIR sensor IC device 206 and the image sensor IC device 208.

Elements of the sensor PCB thermal-control subsystem 112 also include a third TIM 232 (e.g., an image sensor IC device backside TIM) and a third heat spreader 234 (e.g., an image sensor IC device heat spreader). As illustrated in FIG. 1, the third TIM 232 is in thermal contact with, and positioned between, the third heat spreader 234 and a second surface of the sensor PCB 210 that is opposite to the first surface upon which the PIR sensor IC device 206 and image sensor IC device 208 are mounted.

The sensor PCB thermal-control subsystem 112 may include different combinations of materials. The third TIM 232 may be made up of a gel material with high thermal-conductivity (e.g., W/(m·K)) that includes a silicone-rubber material injected with nanoparticles such as aluminum, beryllium-nitride, and so on.

Generally, depending upon varying thermal-loading conditions (e.g., thermal-loading conditions that vary with changes to ambient temperatures, solar intensity, or operative power of the SoC IC device 202), the logic PCB thermal-control subsystem 110 and the sensor PCB thermal-control subsystem 112 may each transfer a different quantity of heat. For example, for a given thermal-loading condition, the logic PCB thermal-control subsystem 110 may transfer (e.g., through convection, radiation, and/or conduction) a first quantity of heat to the first housing component 214 and the second housing component 216. For the same given thermal-loading condition, the sensor PCB thermal-control subsystem 112 may transfer (e.g., through convection, radiation, and/or conduction) a second quantity of heat to the first housing component 214 and the second housing component 216.

When coupled, the first housing component 214 and the second housing component 216 combine to form a housing that has an elongated shape. In general, the pressable button 212 and the image sensor device 132 are positioned at opposite ends of the elongated shape. The thermal-control system 108 may be located within the housing, with at least some portions of the thermal-control system 108 located between the pressable button 212 and the image sensor device 132.

The logic PCB thermal-control subsystem 110 and the sensor PCB thermal-control subsystem 112 are passive. As designed, neither the logic PCB thermal-control subsystem 110 nor the sensor PCB thermal-control subsystem 112 require active or powered fans or pumps to concurrently maintain temperatures of multiple thermal zones (e.g., multiple thermal zones of the video-recording doorbell 102 of FIG. 1) at or below prescribed temperature thresholds.

Figure 3:
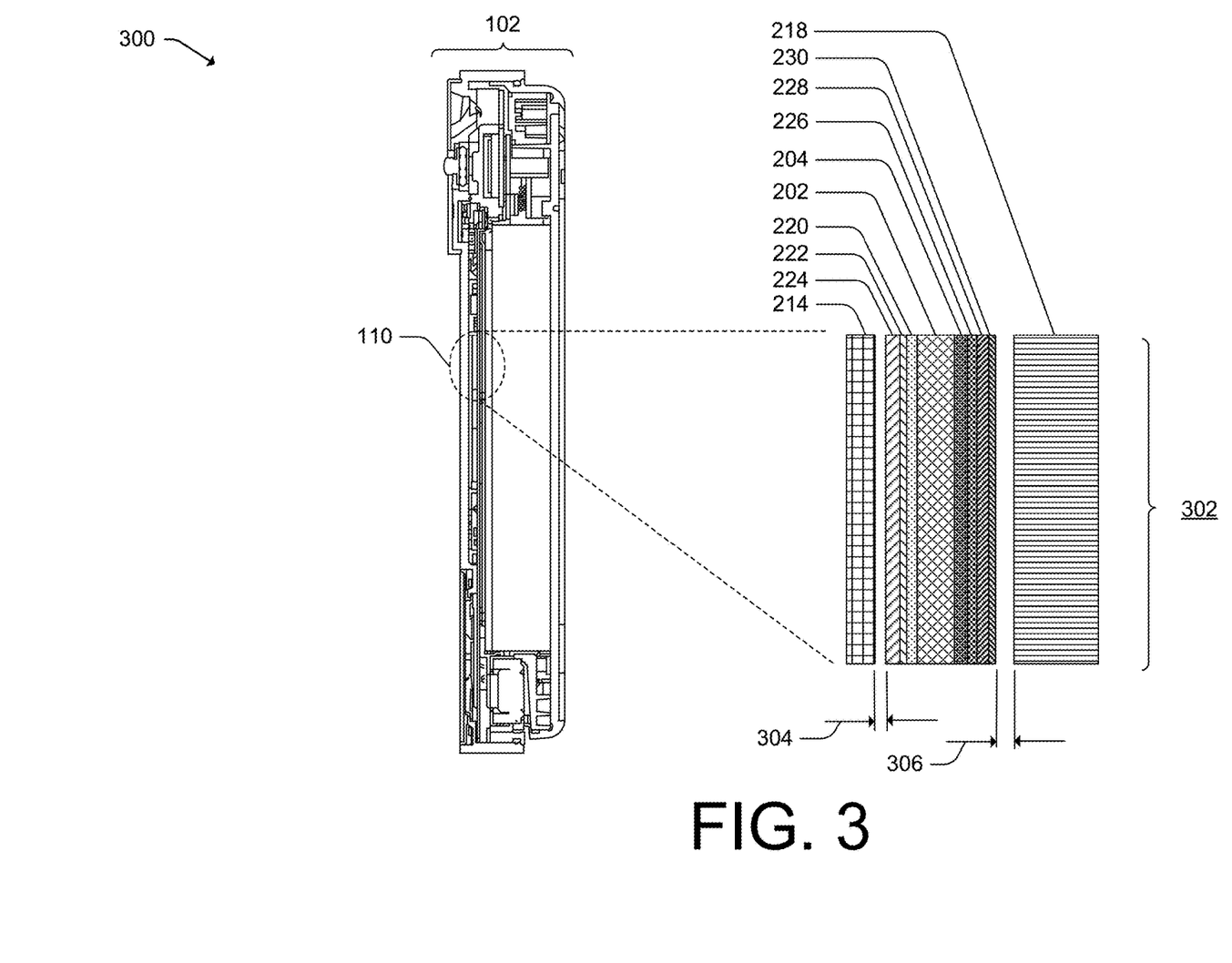
FIG. 3 illustrates a cross-section view and a magnified cross-section view of an example logic PCB thermal-control subsystem.

FIG. 3 illustrates a cross-section view 300 and a magnified cross-section view 302 of the logic PCB thermal-control subsystem 110. The magnified cross-section view 302 illustrates details of the logic PCB thermal-control subsystem 110. Beginning at the far left of the magnified cross-section view 302 is the first housing component 214 (e.g., the top-housing component) and the first heat spreader 224. A first air gap 304 separates the first housing component 214 and the first heat spreader 224. A width of the first air gap 304 may be varied to change thermal heat transfer characteristics between the first heat spreader 224 and the first housing component 214 (e.g., increasing the width of the first air gap 304 will decrease a thermal conductivity and decrease rates of heat exchange through convection and/or radiation between the first heat spreader 224 and the first housing component 214).

Additionally, the first hybrid graphite sheet 222 distributes heat across the first heat spreader 224 (e.g., the EMI shield heat spreader). The first heat spreader 224 may spread a quantity of heat originating across the first heat spreader 224, effectuating an increase in efficiency and effectiveness with which the first heat spreader 224 exchanges heat with the first housing component 214.

The magnified cross-section view 302 also illustrates the first TIM 220 (e.g., the SoC IC device topside TIM) positioned between the first hybrid graphite sheet 222 and the SoC IC device 202. The first TIM 220 may serve as a conduction path between the SoC IC device 202 and the first hybrid graphite sheet 222. By reducing air gaps and/or bond line gaps between the SoC IC device 202 and the first hybrid graphite sheet 222, the first TIM 220 improves thermal conductivity and increases an efficiency and effectiveness with which the SoC IC device 202 exchanges heat with the first hybrid graphite sheet 222.

The magnified cross-section view 302 also illustrates the logic PCB 204 to which the SoC IC device 202 is mounted. The SoC IC device 202 may be mounted to the first surface of the logic PCB 204 through surface-mount techniques (e.g., soldering external, electrical contacts of the SoC IC device 202 to electrically conductive pads of the logic PCB 204). The logic PCB 204 may be a multi-layer PCB, with layers of aluminum or copper traces that communicate signals between the SoC IC device 202 to other components of the video-recording doorbell 102. In some instances, a thickness of the logic PCB 204 can be in a range that is between approximately 0.40 millimeters (mm) and 0.50 mm.

The magnified cross-section view 302 also includes the second TIM 226 (e.g., the SoC IC device backside TIM) that is located between the second surface of the logic PCB 204 and the second heat spreader 228 (e.g., the logic PCB heat spreader). In some instances, the second heat spreader 228 may be stamped from a metal such as an aluminum alloy, a copper material, and so on. The second heat spreader 228 may have a thickness that is in a range between approximately 0.40 mm and 0.50 mm. The magnified cross-section view 302 also illustrates the second hybrid graphite sheet 230 that is adhered to the second heat spreader 228.

Continuing in FIG. 3, the magnified cross-section view 302 illustrates a second air gap 306 that separates the second hybrid graphite sheet 230 from the battery 218. A width of the second air gap 306 may be varied to change thermal heat transfer characteristics between second hybrid graphite sheet 230 and the battery 218 (e.g., increasing the width of the second air gap 306 may reduce thermal conductivity and decrease rates of heat exchange through convection and/or radiation between the second hybrid graphite sheet 230 and the battery 218). In some instances, the second air gap 306 may impede heat of the internal heat load 106 (e.g., $q_i$ of FIG. 1) from transferring into the battery 218.

Figure 4:
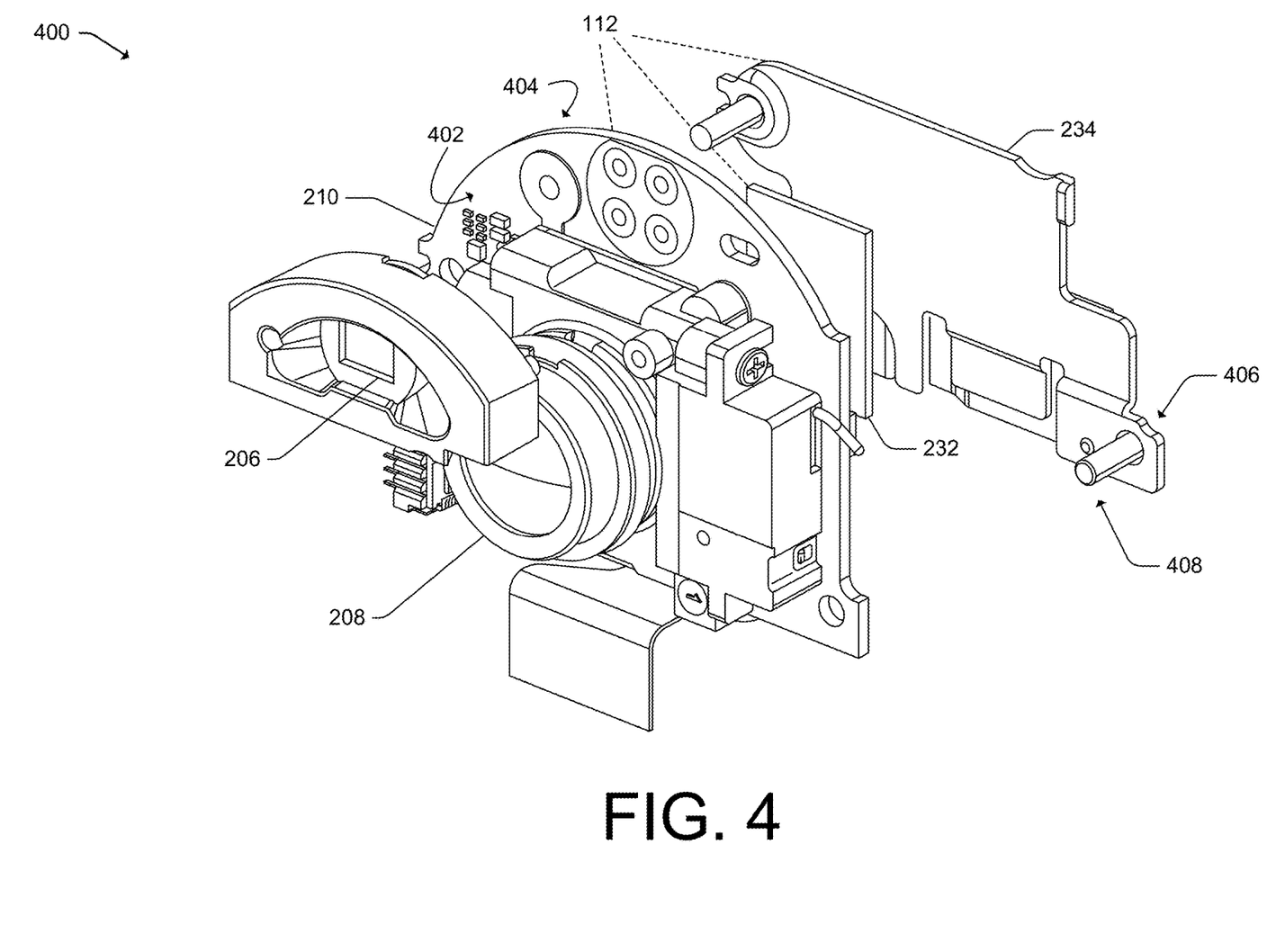
FIG. 4 illustrates an isometric exploded view of an example sensor PCB thermal-control subsystem.

FIG. 4 illustrates an isometric exploded view 400 of the sensor PCB thermal-control subsystem 112 of FIG. 1. The isometric exploded view 400 illustrates the sensor PCB 210 having a surface 402 to which the PIR sensor IC device 206 and the image sensor IC device 208 are mounted. The isometric exploded view 400 also illustrates the third TIM 232 positioned between the third heat spreader 234 and another surface 404 of the sensor PCB 210 that is opposite to the surface upon which the PIR sensor IC device 206 and image sensor IC device 208 are mounted. In an assembled state, the third TIM 232 is in thermal contact with the sensor PCB 210 and the third heat spreader 234. The third heat spreader 234 may include a material such as a copper material or an aluminum alloy material. The third heat spreader 234 may also have a shape that conforms substantially to that of the sensor PCB 210.

In some instances, the third heat spreader 234 may include one or more flange(s) 406 and/or one or more alignment pin(s) 408. The flange(s) 406 and the alignment pin(s) 408, in some instances, may position the third heat spreader 234 relative to the sensor PCB 210 such that thermal contact between features of the sensor PCB 210 and the third heat spreader 234 is optimized (e.g., for thermal conduction). The flange(s) 406 and the alignment pin(s) 408 may further contribute to the sensor PCB thermal-control subsystem 112 as thermal conduction paths between the sensor PCB 210 and the third heat spreader 234. In some instances, the flange(s) 406 may also perform as mechanical standoffs that are conducive to a desired thickness and/or compression of the third TIM 232.

In some instances, the third TIM 232 may include a thermal pad. Examples of the thermal pad include a preformed solid material that is silicone or paraffin wax-based. The third TIM 232 may provide a conductive path for heat generated by the PIR sensor IC device 206 and the image sensor IC device 208 to the third heat spreader 234, which may transfer the generated heat through convection and/or radiation to other elements (e.g., the first housing component 214 and/or to the second housing component 216 illustrated in FIG. 1). In some instances, a hybrid graphite sheet (not illustrated in FIG. 3) may also adhere to one or more surfaces of the third heat spreader 234.

In general, the sensor PCB thermal-control subsystem 112 may contribute to maintaining multiple thermal zones of a video-recording doorbell (e.g., the video-recording doorbell 102 of FIG. 1) at or below a prescribed temperature threshold. Depending on differences in thermal potentials (e.g., temperatures) in or on a video-recording doorbell, features of the sensor PCB thermal-control subsystem 112 (e.g., the sensor PCB 210, the third TIM 232, and the third heat spreader 234) may perform in unison to transfer heat away from the PIR sensor IC device 128 and/or the image sensor device 132 to housing components of the video-recording doorbell.

Figure 5:
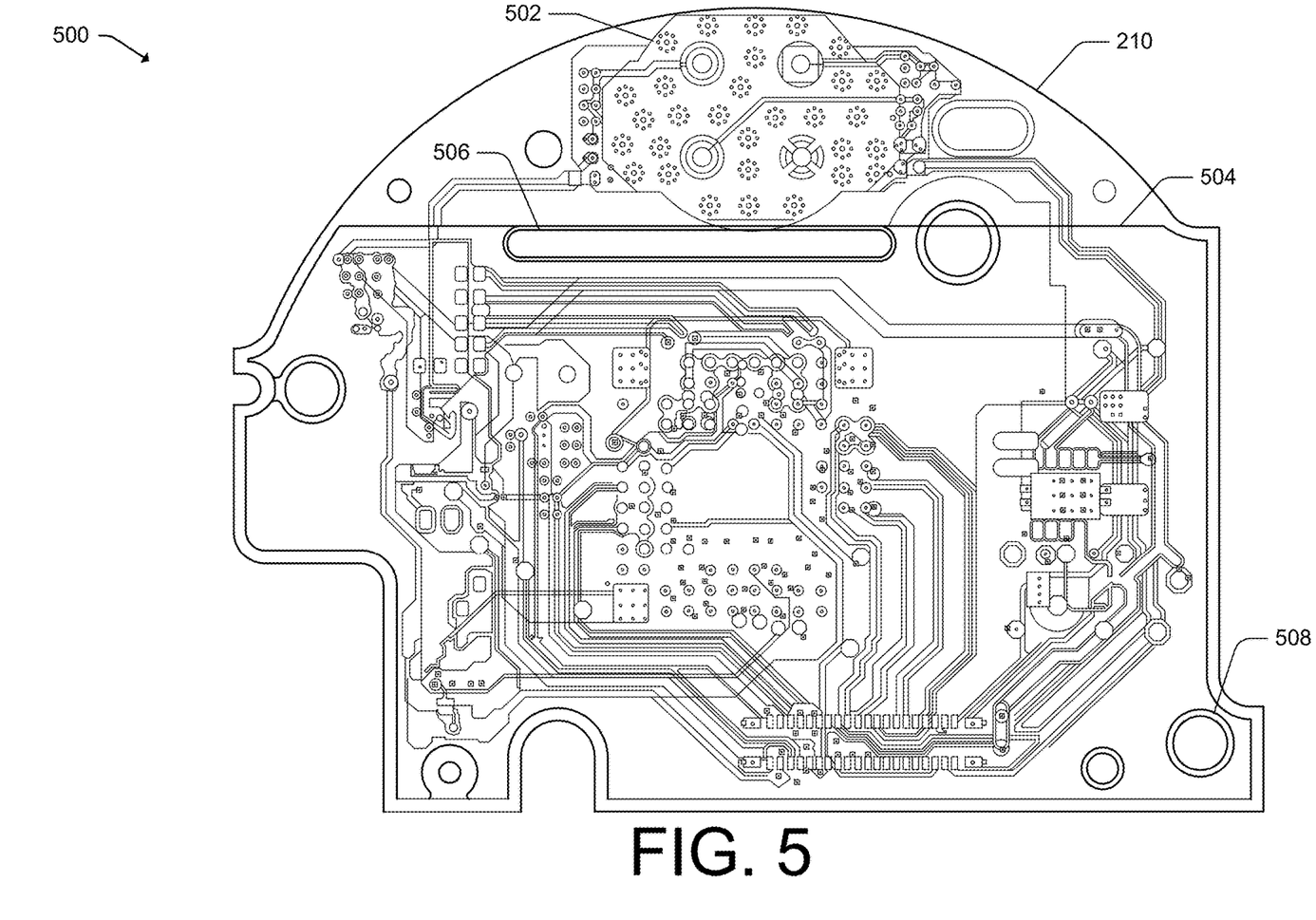
FIG. 5 illustrates details of an example sensor PCB.

FIG. 5 illustrates details 500 of the sensor PCB 210 of FIG. 2. As illustrated, the sensor PCB 210 includes several features directed to improving heat transfer characteristics. The sensor PCB 210 includes a first ground plane 502 that is thermally isolated from a second ground plane 504 (e.g., metal layering features that form the first ground plane 502 and the second ground plane 504 are independent of one another with no shared metallic paths to conduct electrical and/or thermal energy). As illustrated, the sensor PCB 210 includes a slot 506 that thermally separates the first ground plane 502 from the second ground plane 504.

The first ground plane 502 and the second ground plane 504 may be ground planes for different sensors. For example, the first ground plane 502 may be a ground plane for a PIR sensor IC device (e.g., the PIR sensor IC device 206 of FIGS. 2 and 4), and the second ground plane 504 may be a ground plane for an image sensor IC device (e.g., the image sensor IC device 208 of FIGS. 2 and 4). Due to the thermal isolation of the first ground plane 502 from the second ground plane 504, transfer of heat between sensors is prevented. In some instances, the first ground plane 502 and the second ground plane 504 may be formed from a material that has a thermal conductivity and/or a thermal capacitance (e.g., a copper material). In some instances, the sensor PCB 210 may include one or more hole(s) 508 that may be used to align the sensor PCB 210 to a heat spreader.

Figure 6:
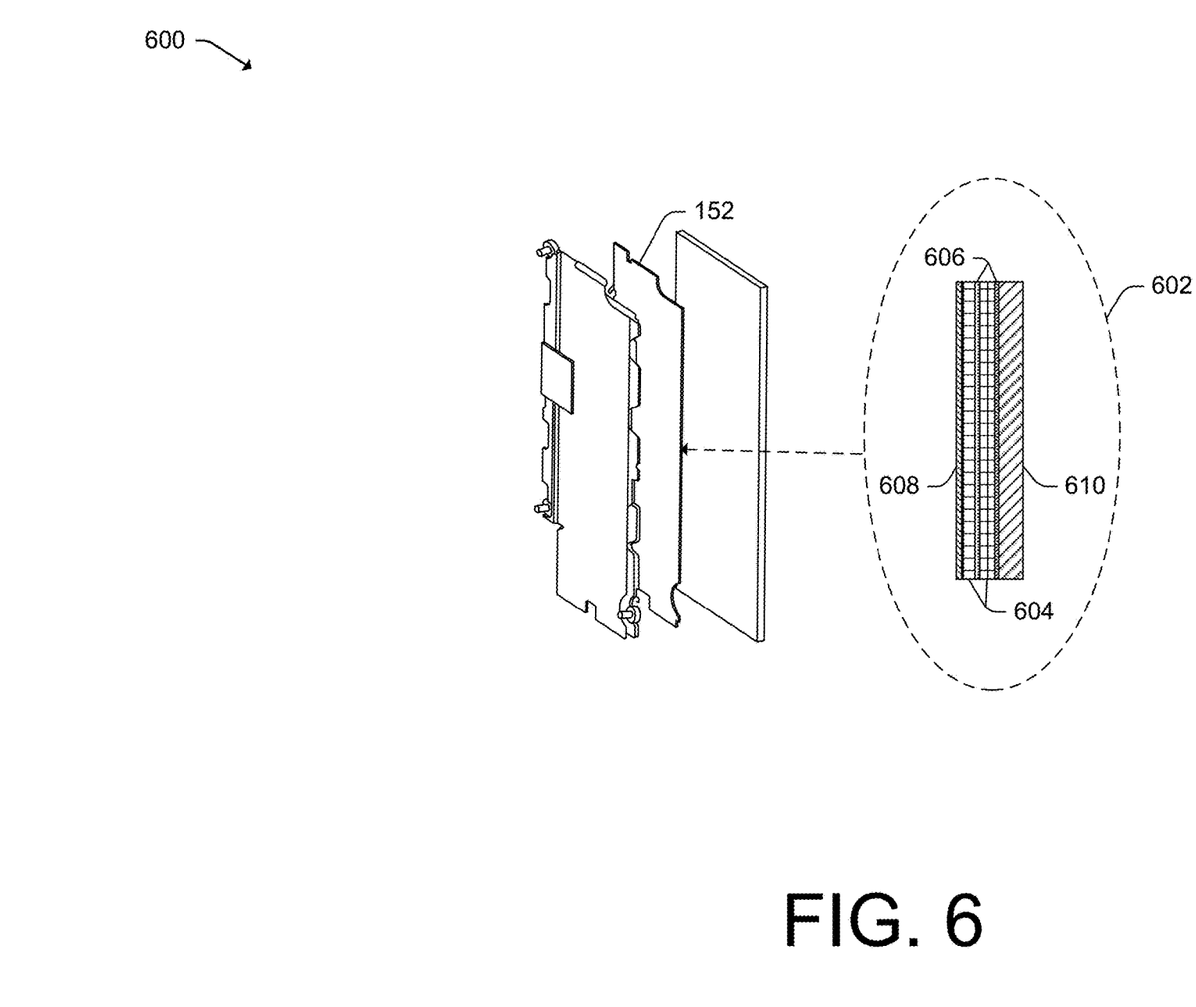
FIG. 6 illustrates example details of a hybrid graphite sheet that may be used as part of a thermal-control system of a video-recording doorbell.

FIG. 6 illustrates details 600 of an example hybrid graphite sheet that may be used as part of a thermal-control system of a video-recording doorbell. The hybrid graphic sheet may be the second hybrid graphite sheet 230 of FIGS. 2 and 3, used in the video-recording doorbell of FIG. 1.

The second hybrid graphite sheet 230 may include a layering 602 of graphite, PSA, and PET films. As illustrated, the layering 602 includes two layers of graphite film 604, two layers of PSA film 606, a layer of PET protective film 608, and a layer of PET release film 610.

Although FIG. 6 illustrates the layering 602 included as part of the second hybrid graphite sheet 230, the layering 602 (or variations thereof) may be included in other hybrid graphite sheets (e.g., the first hybrid graphite sheet 222 of FIG. 1, not illustrated).

Figure 7:
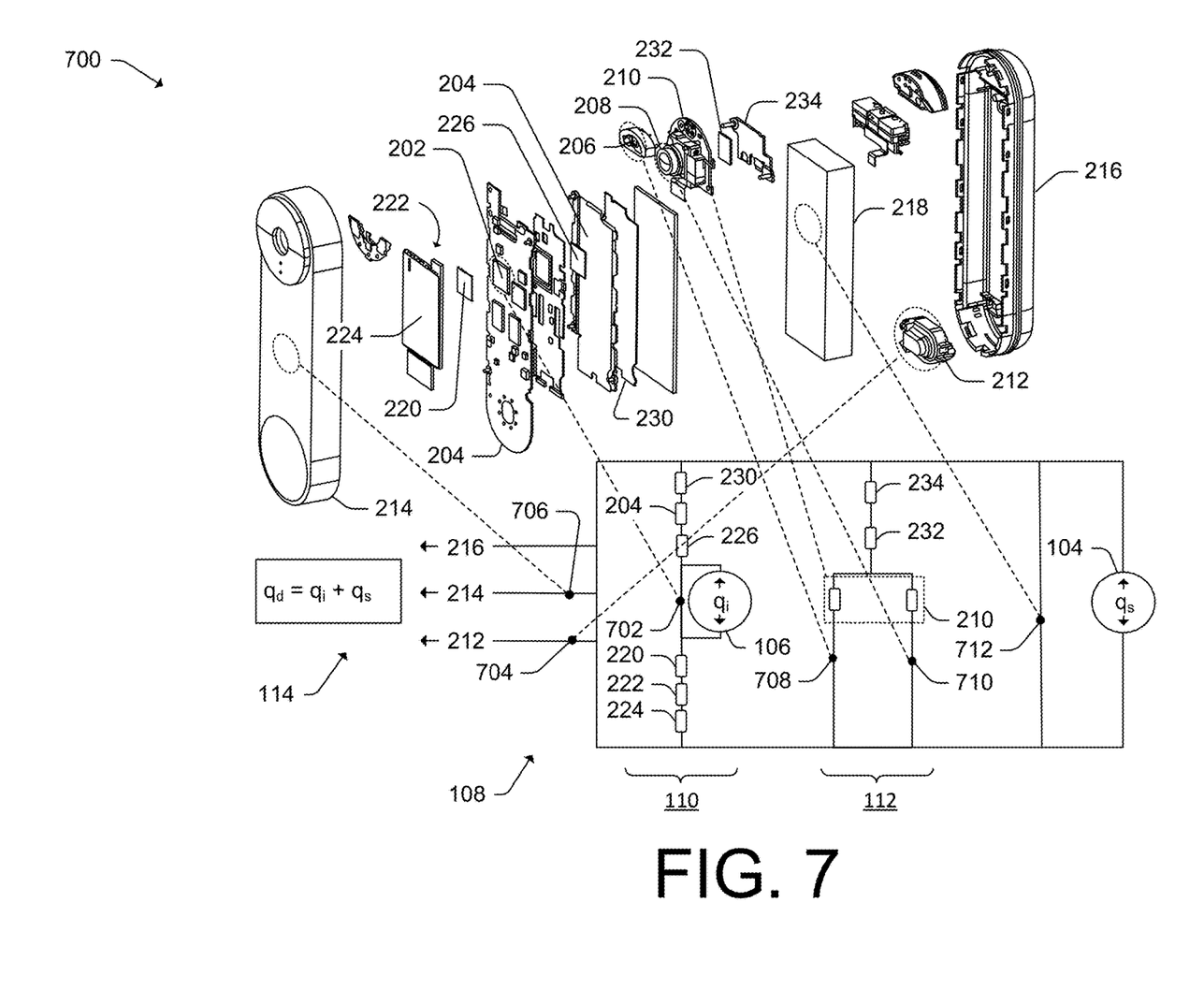
FIG. 7 illustrates example details of multiple thermal zones controlled by a thermal-control system of a video-recording doorbell.

FIG. 7 illustrates example details 700 of multiple thermal zones controlled by the thermal-control system 108 of the video-recording doorbell 102. Included in FIG. 7 is an example schematic (also referred to as a thermal circuit diagram) depicting sources of thermal loading and paths for heat transfer within the video-recording doorbell 102. In general, the thermal-control system 108 may spread, store, and dissipate energy from a thermal-loading condition (e.g., the solar heat load 104 in combination with the internal heat load 106) effectuated upon the video-recording doorbell 102 to concurrently maintain temperatures of the multiple thermal zones within the video-recording doorbell 102.

The multiple thermal zones include a first thermal zone 702, including the SoC IC device 202. The first thermal zone 702 may have a first prescribed temperature threshold corresponding to a maximum allowable junction temperature of a diode within the SoC IC device 202 under a thermal-loading condition (e.g., when both the solar heat load 104 and the internal heat load 106 are exuding heat upon the video-recording doorbell 102). As an example, the first prescribed temperature threshold may be approximately 100 degrees Celsius (° C.). In such an instance, the thermal-control system 108 may spread and dissipate heat through-out the video-recording doorbell 102 to maintain the first thermal zone 702 at or below the first prescribed temperature threshold (e.g., the junction temperature of the diode within the SoC IC device 202 may be maintained at or below 100° C. under the thermal-loading condition).

A second thermal zone 704 that includes the pressable button 212 is also part of the multiple thermal zones. The pressable button 212 may be a button that a user pushes to activate or ring the doorbell. The second thermal zone 704 may have a second prescribed temperature threshold corresponding to a maximum allowable ergonomic touch temperature of the pressable button 212. As an example, the second prescribed temperature threshold may be approximately 77° C. In such an instance, the thermal-control system 108 may concurrently spread and dissipate heat throughout the video-recording doorbell 102 to maintain the second thermal zone 704 at or below the second prescribed temperature threshold (e.g., the maximum allowable ergonomic touch temperature of the pressable button 212 may be maintained at or below 77° C. under the thermal-loading condition).

A third thermal zone 706 that includes the first housing component 214 and the second housing component 216 is also part of the multiple thermal zones. The third thermal zone 706 may have a third prescribed temperature threshold corresponding to a maximum allowable ergonomic touch temperature of the first housing component 214 and/or the second housing component 216. As an example, the third prescribed temperature threshold may be approximately 85° C. In such an instance, the thermal-control system 108 may concurrently spread and dissipate heat throughout the video-recording doorbell 102 to maintain the third thermal zone 706 at or below the third prescribed temperature threshold (e.g., the maximum allowable ergonomic touch temperature of the first housing component 214 and/or the second housing component 216 may be maintained at or below 85° C. under the thermal-loading condition).

The multiple thermal zones also include a fourth thermal zone 708 that includes the PIR sensor IC device 128. The fourth thermal zone 708 may have a fourth prescribed temperature threshold corresponding to a maximum allowable junction temperature of a diode within the PIR sensor IC device 128. As an example, the second prescribed temperature threshold may be approximately 80° C. In such an instance, the thermal-control system 108 may concurrently spread and dissipate heat throughout the video-recording doorbell 102 to maintain the fourth thermal zone 708 at or below the fourth prescribed temperature threshold (e.g., the junction temperature of the diode within the PIR sensor IC device 128 may be maintained at or below 80° C. under the thermal-loading condition).

A fifth thermal zone 710 that includes the image sensor IC device 208 is also included in the multiple thermal zones. The fifth thermal zone 710 may have a fifth prescribed temperature threshold corresponding to a maximum allowable junction temperature of a diode within the image sensor IC device 208. As an example, the fifth prescribed temperature threshold may be approximately 85° C. In such an instance, the thermal-control system 108 may concurrently spread and dissipate heat throughout the video-recording doorbell 102 to maintain the fifth thermal zone 710 at or below the fifth prescribed temperature threshold (e.g., the junction temperature of the diode within the image sensor IC device 208 may be maintained at or below 85° C. under the thermal-loading condition).

The multiple thermal zones also include a sixth thermal zone 712 that includes the battery 218, which may power the video-recording doorbell 102. The sixth thermal zone 712 may have a sixth prescribed temperature threshold corresponding to a maximum allowable surface temperature of the battery 218. As an example, the sixth prescribed temperature threshold may be approximately 80° C. In such an instance, the thermal-control system 108 may concurrently spread and dissipate heat throughout the video-recording doorbell 102 to maintain the sixth thermal zone 712 at or below the sixth prescribed temperature threshold (e.g., the surface temperature of the battery 218 may be maintained at or below 80° C. under the thermal-loading condition).

The thermal-control system 108 may include a combination of thermal-control subsystems (e.g., the logic PCB thermal-control subsystem 110 and the sensor PCB thermal-control subsystem 112) operating in parallel to concurrently spread heat throughout the video-recording doorbell 102. The thermal-control subsystems may concurrently spread the heat (e.g., solar heat load 104, internal heat load 106) throughout the video-recording doorbell 102 using heat transfer modes that include conduction, convection, and/or radiation. The heat may subsequently be dissipated through exterior surfaces of the video-recording doorbell 102 (e.g., surfaces of the pressable button 212, the first housing component 214, the second housing component 216) to concurrently maintain temperatures of the multiple thermal zones (702, 704, 706, 708, 710, 712) at or below prescribed temperature thresholds. Furthermore, and in general, the thermal-control system 108 is a passive thermal-control system.

Although techniques using and apparatuses for a thermal-control system of a video-recording doorbell are described, it is to be understood that the subject of the appended claims is not necessarily limited to the specific features or methods described. Rather, the specific features and methods are disclosed as example ways in which a thermal-control system of a video-recording doorbell can be implemented.

What is claimed is:

1. A thermal-control system for a video-recording doorbell, the thermal-control system comprising:
    a first thermal-control subsystem, the first thermal-control subsystem configured to transfer a first quantity of heat to a first housing component and a second housing component of the video-recording doorbell, the first thermal-control subsystem including:
        a first thermal interface material, the first thermal interface material positioned between a first hybrid graphite sheet and a system-on-chip integrated circuit device mounted to a first surface of a logic printed circuit board, the first hybrid graphite sheet fixed to a first heat spreader; and
        a second thermal interface material, the second thermal interface material positioned between a second heat spreader and a second surface of the logic printed circuit board that is opposite the first surface, the second heat spreader having a second hybrid graphite sheet fixed to the second heat spreader; and
    a second thermal-control subsystem, the second thermal-control subsystem configured to transfer a second quantity of heat to the first housing component and the second housing component of the video-recording doorbell, the second thermal-control subsystem including:
        a sensor printed circuit board including a first ground plane for a passive infrared sensor integrated circuit device and a second ground plane for an image sensor integrated circuit device, the passive infrared sensor integrated circuit device and the image sensor integrated circuit device mounted to a first surface of the sensor printed circuit board; and
        a third thermal interface material, the third thermal interface material positioned between a second surface of the sensor printed circuit board and a third heat spreader.

2. The thermal-control system of claim 1, wherein:
    the first housing component is elongated along a first axis and includes a first set of opposing ends, the first set of opposing ends having a generally radial curvature; and
    the second housing component is elongated along a second axis that is generally parallel to the first axis, the second housing component complementary to the first housing component and having a second set of opposing ends substantially matching the generally radial curvature of the first set of opposing ends of the first housing component.

3. The thermal-control system of claim 1, wherein the first thermal interface material includes a gel material that includes a silicone-rubber material injected with nanoparticles.

4. The thermal-control system of claim 1, wherein the first heat spreader is part of an electromagnetic interference shield.

5. The thermal-control system of claim 4, wherein the first heat spreader includes a copper material.

6. The thermal-control system of claim 1, wherein the first hybrid graphite sheet includes a layering of graphite, pressure-sensitive adhesive, and polyethylene terephthalate films.

7. The thermal-control system of claim 1, wherein the second thermal interface material includes a gel material.

8. The thermal-control system of claim 7, wherein the gel material includes a silicone-rubber material injected with nanoparticles.

9. The thermal-control system of claim 1, wherein the second hybrid graphite sheet includes a layering of graphite, pressure-sensitive adhesive, and polyethylene terephthalate films.

10. The thermal-control system of claim 1, wherein a thickness of the logic printed circuit board is less than or equal to approximately 0.50 millimeters.

11. The thermal-control system of claim 1, wherein the sensor printed circuit board includes a slot that thermally separates the first ground plane for the passive infrared sensor integrated circuit device from the second ground plane for the image sensor integrated circuit device.

12. The thermal-control system of claim 1, wherein the third thermal interface material is a thermal pad.

13. The thermal-control system of claim 12, wherein the thermal pad includes a preformed solid material that is silicone-based or paraffin wax-based.

14. The thermal-control system of claim 1, wherein the second heat spreader includes an aluminum material and has a thickness within a range of approximately 0.40 millimeters to approximately 0.50 millimeters.

15. The thermal-control system of claim 1, wherein the first heat spreader is separated from the first housing component by a first air gap and the second hybrid graphite sheet that is fixed to the second heat spreader is separated from a battery of the video-recording doorbell by a second air gap.

16. A video-recording doorbell comprising:
    a system-on-chip integrated circuit device;
    a pressable button;
    a first housing component;
    a second housing component; and a thermal-control system configured to concurrently maintain temperatures throughout the video-recording doorbell during a thermal-loading condition, the thermal-control system configured to concurrently maintain:
   a first temperature of a first thermal zone at or below a first prescribed temperature threshold, the first thermal zone including the system-on-chip integrated circuit device;
   a second temperature of a second thermal zone at or below a second prescribed temperature threshold, the second thermal zone including the pressable button; and
   a third temperature of a third thermal zone at or below a third prescribed temperature threshold, the third thermal zone including the first housing component and the second housing component.

17. The video-recording doorbell of claim 16, wherein maintaining the first temperature of the first thermal zone at or below the first prescribed temperature threshold relies, in part, upon a first thermal-control subsystem, the first thermal-control subsystem configured to transfer a first quantity of heat to the first and second housing components of the video-recording doorbell, the first thermal-control subsystem including:
   a first thermal interface material, the first thermal interface material positioned between a surface of the system-on-chip integrated circuit device and a first hybrid graphite sheet, the first hybrid graphite sheet adhered to a first heat spreader; and
   a second thermal interface material, the second thermal interface material positioned between a surface of a logic printed circuit board to which the system-on-chip integrated circuit device is attached and a second heat spreader, the second heat spreader having a second hybrid graphite sheet fixed to the second heat spreader.

18. The video-recording doorbell of claim 17, wherein:
the video-recording doorbell further comprises:
   a passive infrared sensor integrated circuit device;
   an image sensor integrated circuit device; and
   a battery; and
the thermal-control system is further configured to concurrently maintain:
   a fourth temperature of a fourth thermal zone at or below a fourth prescribed temperature threshold, the fourth thermal zone including the passive infrared sensor integrated circuit device;
   a fifth temperature of a fifth thermal zone at or below a fifth prescribed temperature threshold, the fifth thermal zone including the image sensor integrated circuit device; and
   a sixth temperature of a sixth thermal zone at or below a sixth prescribed temperature threshold, the sixth thermal zone including the battery.

19. The video-recording doorbell of claim 18, wherein maintaining the fourth temperature of the fourth thermal zone at or below the fourth prescribed temperature threshold and maintaining the fifth temperature of the fifth thermal zone at or below the fifth prescribed temperature threshold relies, in part, upon a second thermal-control subsystem configured to transfer a second quantity of heat to the first and second housing components, the second thermal-control subsystem including:
   a sensor printed circuit board including a separate ground plane for each of the passive infrared sensor integrated circuit device and the image sensor integrated circuit device mounted to a first surface of the sensor printed circuit board; and
   a third thermal interface material, the third thermal interface material positioned between a second surface of the sensor printed circuit board and a third heat spreader, the second surface opposite the first surface.

20. The video-recording doorbell of claim 19, wherein the thermal-control system, including the first thermal-control subsystem and the second thermal-control subsystem, is a passive thermal-control system.

\* \* \* \* \*